United States Patent [19]

Hickernell

[11] Patent Number: 5,471,178
[45] Date of Patent: Nov. 28, 1995

[54] LADDER FILTER AND METHOD FOR PRODUCING CONJUGATELY MATCHED IMPEDANCE

[75] Inventor: Thomas S. Hickernell, Mesa, Ariz.

[73] Assignee: Motorola, Inc., Schaumburg, Ill.

[21] Appl. No.: 191,232

[22] Filed: Feb. 3, 1994

[51] Int. Cl.⁶ ............................................. H03H 9/64
[52] U.S. Cl. ..................... 333/193; 333/195; 310/313 R
[58] Field of Search .................................. 333/193–196; 310/313 R, 313 D

[56] References Cited

U.S. PATENT DOCUMENTS

| | | | |
|---|---|---|---|
| 4,166,258 | 8/1979 | Tseng | 333/195 |
| 4,255,726 | 3/1981 | Kinoshita et al. | 333/195 |
| 4,303,897 | 12/1981 | Augst | 333/189 |
| 4,468,642 | 8/1984 | Hikita | 333/193 |
| 4,577,168 | 3/1986 | Hartmann | 333/170 |
| 4,599,587 | 7/1986 | Hartmann et al. | 333/176 |
| 4,694,266 | 9/1987 | Wright | 333/196 |
| 4,734,664 | 3/1988 | Hikita et al. | 333/193 |
| 4,742,319 | 5/1988 | Sone | 333/195 |
| 4,803,449 | 2/1989 | Hikita et al. | 333/193 |
| 4,954,793 | 9/1990 | Misu et al. | 333/133 |
| 5,115,216 | 5/1992 | Hikita et al. | 333/195 |

Primary Examiner—Robert J. Pascal
Assistant Examiner—Darius Gambino
Attorney, Agent, or Firm—Frederick M. Fliegel

[57] ABSTRACT

A bandpass filter and a method for making a bandpass ladder filter having a center frequency, a first port and a second port. The method has steps of providing a first L network having a first connection, a second connection and an inductive impedance at the center frequency and providing a second L network having a first connection, a second connection and a capacitive impedance at the center frequency. The method further has steps of coupling the first connection of the first L network to the first port, coupling the first connection of the second L network to the second connection of the first L network and coupling the second connection of the second L network to the second port.

21 Claims, 5 Drawing Sheets

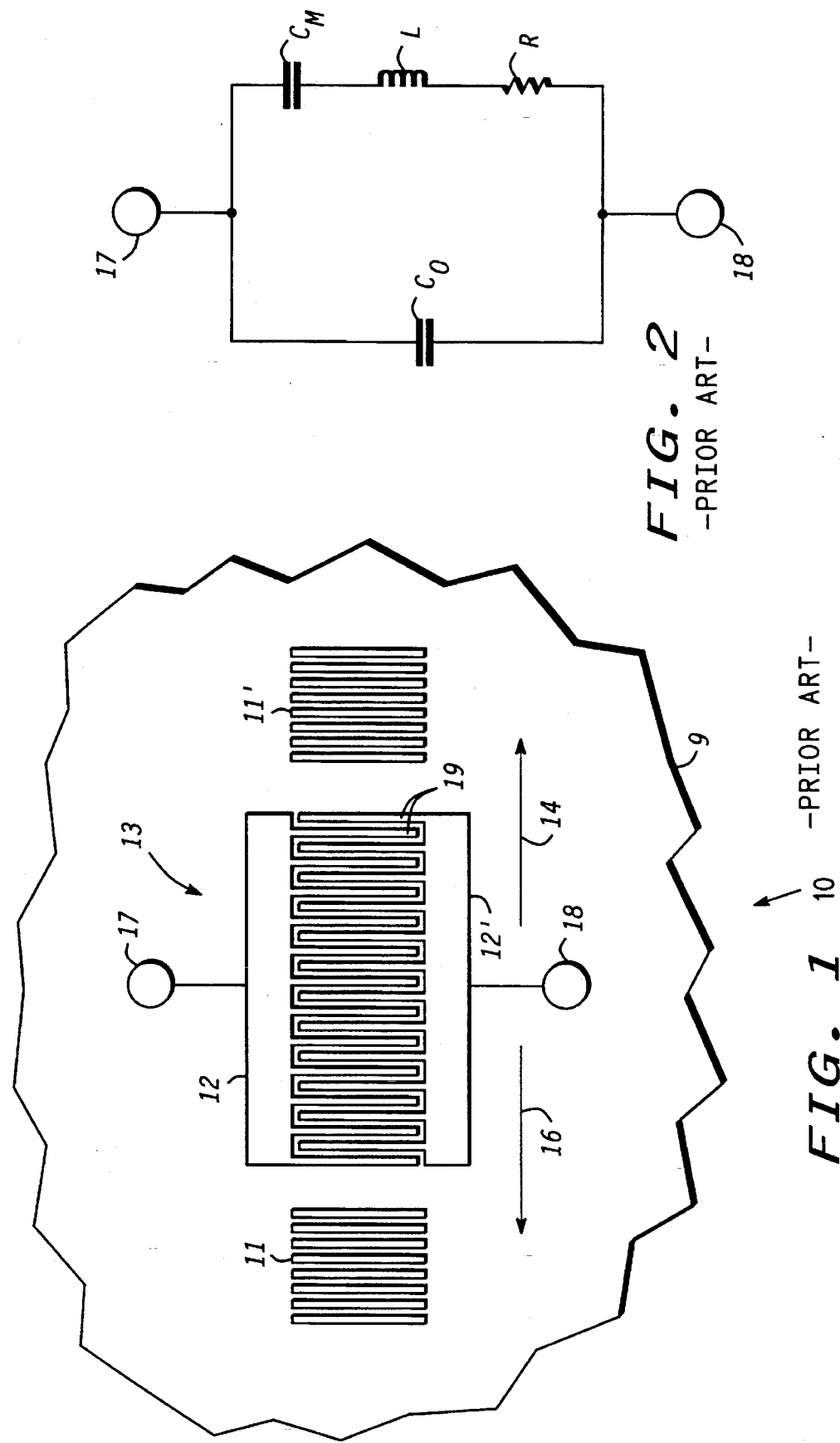

1

LADDER FILTER AND METHOD FOR PRODUCING CONJUGATELY MATCHED IMPEDANCE

CROSS-REFERENCE TO RELATED APPLICATIONS

This application is related to co-pending U.S. patent application Ser. Nos. 08/017,891, filed on Feb. 16 of 1993 and 07/844,333, filed on Mar. 12 of 1992, which are assigned to the same assignee as the present application.

1. Field of the Invention

This invention relates in general to the field of radio frequency apparatus, in particular to radio frequency filters and more particularly to radio frequency filters employing acoustic waves.

2. Background of the Invention

There is an ongoing need for component miniaturization in radio wave communication devices. For example, smaller and more efficient components are needed for light-weight, hand-portable cellular telephones, wireless local area networks for linking computer systems within office buildings in a readily reconfigurable fashion, wristwatch- and credit-card-sized paging apparatus and other devices for promoting rapid, efficient and flexible voice and data communication.

Filters are needed for a variety of such communications applications wherein small size, light weight and high performance are simultaneously required. Increasing numbers of products seek to employ fixed spectral resources, often to achieve tasks not previously envisioned. Examples include cellular telephones, inter- and intra-facility computer-computer and/or computer-ancillary equipment linkages as well as a host of other, increasingly complex inter-personal and/or -equipment information sharing requirements. The desire to render increasingly complicated communications nodes portable and even hand-held and/or -portable and/or pocket-sized places extreme demands on filtering technology in the context of increasingly crowded radio frequency resources.

Acoustic wave filters provide filters meeting stringent performance requirements which are (i) extremely robust, (ii) readily mass produced, (iii) adjustment-free over the life of the unit and which (iv) sharply increase the performance to size ratio achievable in the frequency range extending from a few tens of MegaHertz to about several GigaHertz. However, need for low passband insertion loss simultaneously coupled with demand for high shape factor and high stopband attenuation pose filter design and performance requirements not easily met by a single acoustic wave filter alone.

One approach to satisfying these needs and demands is to cascade two or more acoustic wave filters. This approach realizes increased stopband signal rejection but requires additional matching components (e.g., inductors and/or capacitors) and also multiplies the volume and weight of the acoustic wave filters by the number of such filters cascaded. Matching components additionally incur major size and weight penalties because each transducer generally requires at least two matching components, each of which is at least as large as an acoustic wave filter die.

Another approach is to provide two or more such filters on a single substrate, wherein the filters are designed to have purely real impedances matched one to another without requiring intervening matching components. One realization includes a series-parallel arrangement of resonant elements having staggered center frequencies and arranged in a ladder structure, i.e., a structure comprising cascaded sections each including a series resonant element followed by a shunt resonant element. Typically, within each section, the anti-resonant frequency of the shunt element is chosen to be the resonant frequency of the accompanying series element, providing pure real input and output impedances. Disadvantages of this approach when implemented employing SAW resonators include a fixed bandwidth for the electromechanical coupling coefficient ($k^2$) associated with the chosen substrate material. Prior art ladder filter structures employing piezoelectric series and/or shunt elements have generally been confined to extremely narrow bandwidths, on the order of 0.01% to 0.1%, in part because they have been implemented with piezoelectric materials having very low electromechanical coupling coefficients. Generally, conventional approaches are such that when three of the filter material, impedance, selectivity and bandwidth characteristics are specified, the fourth is also determined.

What is needed is a ladder filter configuration/design methodology providing flexible bandwidth, suitable out-of-band rejection and low in-band insertion loss, not requiring external matching components, drift-free performance and realizable in compact, monolithic form.

SUMMARY OF THE INVENTION

A bandpass filter and a method for making a bandpass ladder filter having a center frequency, a first port and a second port are described. The method includes steps of providing a first L network having a first connection, a second connection and an inductive impedance at the center frequency and providing a second L network having a first connection, a second connection and a capacitive impedance at the center frequency. The method further includes steps of coupling the first connection of the first L network to the first port, coupling the first connection of the second L network to the second connection of the first L network and coupling the second connection of the second L network to the second port.

BRIEF DESCRIPTION OF THE DRAWING

The invention is pointed out with particularity in the appended claims. However, a more complete understanding of the present invention may be derived by referring to the detailed description and claims when considered in connection with the figures, wherein like reference characters refer to similar items throughout the figures, and:

FIG. 1 is a simplified plan view of an acoustic wave resonator including optional reflectors;

FIG. 2 is a schematic diagram of a simplified equivalent circuit for the resonator of FIG. 1;

Figure 3:
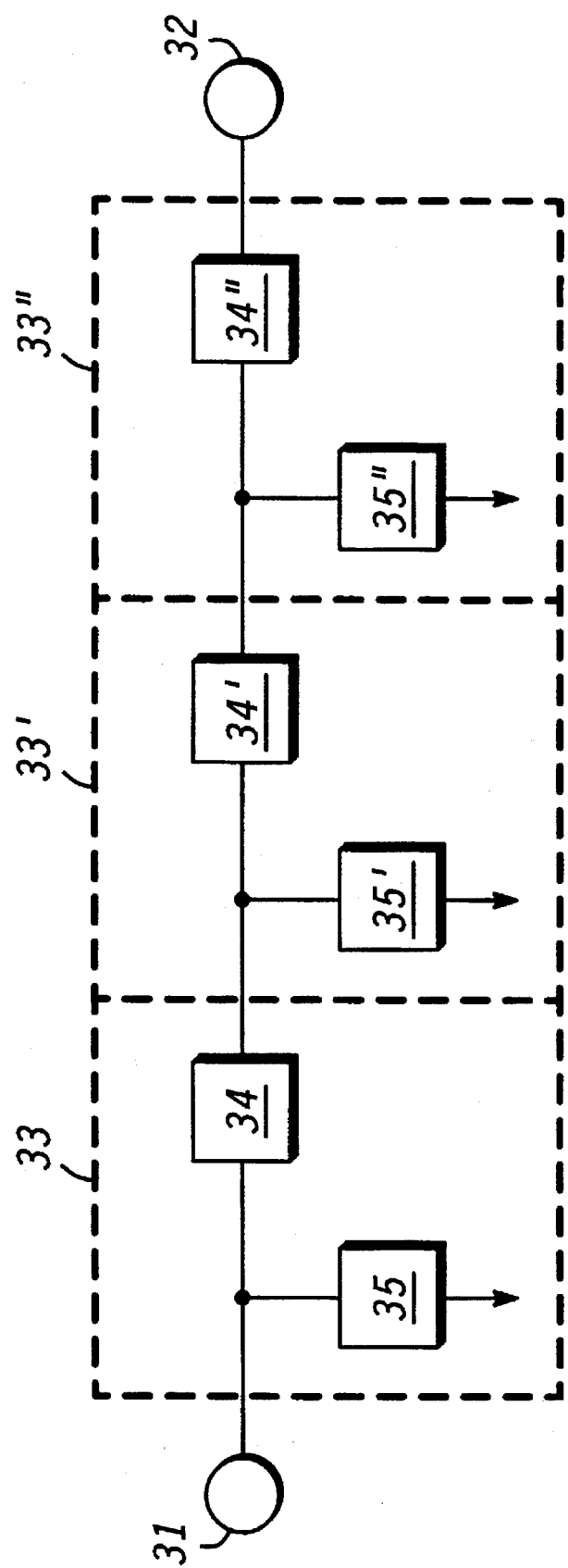
FIG. 3 is a simplified plan view of a three section ladder filter in accordance with the present invention.

The exemplification set out herein illustrates a preferred embodiment of the invention in one form thereof, and such exemplification is not intended to be construed as limiting in any manner.

DETAILED DESCRIPTION OF THE DRAWING

FIG. 1 is a simplified plan view of acoustic wave resonator 10 including acoustic wave transducer 13 comprising interdigitated electrodes 19 (also referred to herein as "fingers", "finger electrodes" etc.) coupled alternately to first terminal 17 or second terminal 18 via bus bars 12, 12', respectively Resonator 10 optionally includes reflectors 11, 11' disposed to either side of transducer 13 in principal directions of acoustic wave propagation 14, 16. Reflectors 11, 11' typically comprise metal electrodes analogous to electrodes 19 that are either electrically isolated one from another or coupled to only one of bus bars 12, 12' within a particular reflector 11, 11' or which may be electrically connected together within a particular reflector 11, 11' but not electrically connected to features outside of that particular reflector 11, 11'.

Electrodes 19 typically are periodic and define a particular acoustic wavelength at which transducer 13 exhibits a characteristic acoustic center frequency together with a center frequency wavelength for the acoustic energy transduced in response to electrical stimulation of an appropriate frequency applied via terminals 17, 18. Electrodes 19 are usefully about one-fourth of this center frequency wavelength wide, i.e., measured along directions 14, 16 but may be chosen to have other dimensions in accordance with design principles and performance objectives for resonator 10.

Reflectors 11, 11' typically include electrodes or other reflective structures one-fourth of this wavelength wide, i.e., measured along directions 14, 16, because electrodes of this width tend to be reflective, however, other widths providing suitable reflection characteristics may be usefully employed and this width may be chosen to accommodate the reflection characteristics of the materials employed for resonator 10, including substrate 9.

Resonator 10 is usefully fashioned on a polished surface of substrate 9 by photolithographic techniques similar to those employed for manufacturing of other microelectronic components and directions 14, 16 are carefully aligned with a preferred crystallographic axis providing the desired acoustic transduction, propagation and reflection characteristics.

FIG. 2 is a schematic diagram of a simplified equivalent circuit for resonator 10 of FIG. 1. Values for components $C_o$, $C_m$, L, R shown in FIG. 2 are found from Eqs. 1–3, the geometry of transducer 13 and relevant material constants. R may be usefully estimated as zero (i.e., ignored) or may be modeled from empirical data. Values of a few Ohms are often encountered in practice. R represents bulk wave radiation, acoustic propagation away from the receiving transducer, metal resistivity, diffraction effects and other losses encountered in resonant elements. Static capacitance $C_o$ is found from:

$$C_o = C_e N W, \qquad (1)$$

where $C_e$ is a material parameter describing capacitance per finger pair per cm (tabulated for many materials in a variety of textbooks), N represents the number of transducer finger pairs (i.e., pairs of electrodes 19 in transducer 13, FIG. 1) and W represents the overlap of electrodes 19 in cm (transverse to directions 14, 16).

Motional capacitance $C_m$ is related to static capacitance $C_o$:

$$C_m = (8k^2 C_o)/(\pi^2), \qquad (2)$$

where $k^2$ represents the electromechanical coupling coefficient (tabulated in a variety of textbooks related to piezoelectric materials). Motional inductance L is given by:

$$L = 1/(C_m \omega_r^2), \qquad (3)$$

where $\omega_r$ represents the radian transducer resonant frequency.

Admittance Y measured between terminals 17, 18 of FIG. 2 is:

$$Y = j\omega C_o + 1/(R + j(\omega L - 1/(\omega C_m))). \qquad (4)$$

Admittance Y has resonant frequency $\omega_r$, usually close to and slightly lower than the acoustic center frequency (approximately the sound velocity divided by the acoustic wavelength associated with the periodicity of electrodes 19 of transducer 13):

$$\omega_r = (LC_m)^{-0.5}, \qquad (5)$$

and antiresonant frequency $\omega_a$:

$$\omega_a = \omega_r (1 + C_m/C_o)^{0.5}, \qquad (6)$$

or $$\omega_a = \omega_r (1 + 8k^2/\pi^2)^{0.5}. \qquad (7)$$

Antiresonant frequency $\omega_a$ is always greater than resonant frequency $\omega_r$ by a ratio determined by electromechanical coupling coefficient $k^2$ (Eq. 7). For extremely high coupling coefficients (e.g., $k^2 > 5\%$), an appropriate coupling coefficient value may need to be empirically determined because the assumptions employed in relating physical parameters (e.g., acoustic wavelength, radiation conductance, $\omega_a$, $\omega_r$, etc.) to each other and to acoustic center frequencies are not entirely valid. In accordance with the present invention, coupling coefficients are generally usefully greater than 0.0001, more usefully greater than 0.01, generally desirably greater than 0.05, more desirably greater than 0.07 and preferably greater than 0.10.

FIG. 3 is a simplified plan view of three section ladder filter 30 having first and second ports 31, 32 in accordance with the present invention. Ladder filter 30 is typically specified to have a passband bandwidth about a center frequency $f_o$. Three section ladder filter 30 comprises first section 33 having series element 34 and shunt element 35, second section 33' having series element 34' and shunt element 35' and third section 33" having series element 34" and shunt element 35". In one embodiment, series elements 34, 34" may be chosen to be nominally identical and similarly shunt elements 35, 35". A fourth series element (not illustrated) may optionally be coupled between series element 34" and port 32, with shunt element 35" coupled to series element 34" as shown.

Second section 33' may be chosen to have narrower bandwidth and correspondingly an inductive impedance characteristic over at least a portion of the filter passband in accordance with the present invention. In this scenario, first section 33 and/or third section 33" may be chosen to have broader bandwidth and correspondingly capacitive impedance characteristic over the same filter passband portion such that the inductive characteristic of second section 33' essentially cancels capacitive contributions from the combination of first 33 and third 33" sections.

Alternatively, second section 33' may be chosen to represent a broader bandwidth and a capacitive impedance characteristic over a portion of the filter passband. The combination of first 33 and third 33" sections then provides a narrower passband and an inductive impedance over a portion of the filter passband, with the capacitive impedance component of second section 33' essentially canceling the inductive contributions from the combination of first 33 and third 33" sections over at least part of the filter passband.

On the other hand, first 33 and second 33' sections may provide a combined reactance essentially canceling the reactive impedance component of third section 33" or first section 33 may provide a reactance essentially canceling the reactive impedance component provided by the combination of second 33' and third 33" sections.

In general, the combined reactive impedances of any group of sections may be contributed in essentially equal parts from each section, may depend more heavily on one section or group of sections than another or may be essentially derived from only a subset of sections or a single section. Further, when a complex load or source impedance is desired or required, the combined impedances may be chosen to provide a complex conjugate match thereto.

Prior art ladder filters typically employ elements wherein the resonant frequency of the series elements are chosen to be equal to the antiresonant frequencies of the shunt elements. In traditional narrow-band crystal lattice filters employing quartz resonant elements, electromechanical coupling coefficient $k^2$ is typically much smaller than 0.5%, limiting the fractional bandwidth (bandwidth divided by Center frequency) achievable for such filters to very small values.

Applicants have discovered that use of much higher coupling coefficient materials (e.g., $LiNbO_3$, $LiTaO_3$ etc.) provide much greater spread between resonant and antiresonant frequencies. For example, 64° $LiNbO_3$ provides a coupling coefficient in the range of from 9% to 13%, 41° $LiNbO_3$ provides coupling coefficients in the range from 15–25% and 36° $LiTaO_3$ provides coupling coefficients in the range from 6.5–8%. This increased frequency spread in turn allows greater design freedom.

Applicants have discovered that choosing resonant frequency $\omega_r$ of the series resonant element to be less than antiresonant frequency $\omega_a$ of the shunt resonant element provides an L section having narrower bandwidth than the conventional approach (resonant frequency $\omega_r$ of the series resonant element equal to antiresonant frequency $\omega_a$ of the shunt element) and also having a positive imaginary impedance component (i.e., inductive reactance) at the desired filter center frequency $f_o$. Similarly, choosing resonant frequency $\omega_r$ of the series resonant element to be greater than antiresonant frequency $\omega_a$ of the shunt resonant element provides a section having greater bandwidth than the conventional approach and also having a negative imaginary impedance component (i.e., capacitive reactance) at the desired filter center frequency $f_o$. Combining a filter section having a negative impedance component with a filter section having a positive impedance component allows complex conjugate impedance matching between sections, providing reduced insertion loss at and near the filter center frequency $f_o$ and greater flexibility in filter bandwidth selection.

EXAMPLE

Figure 4:
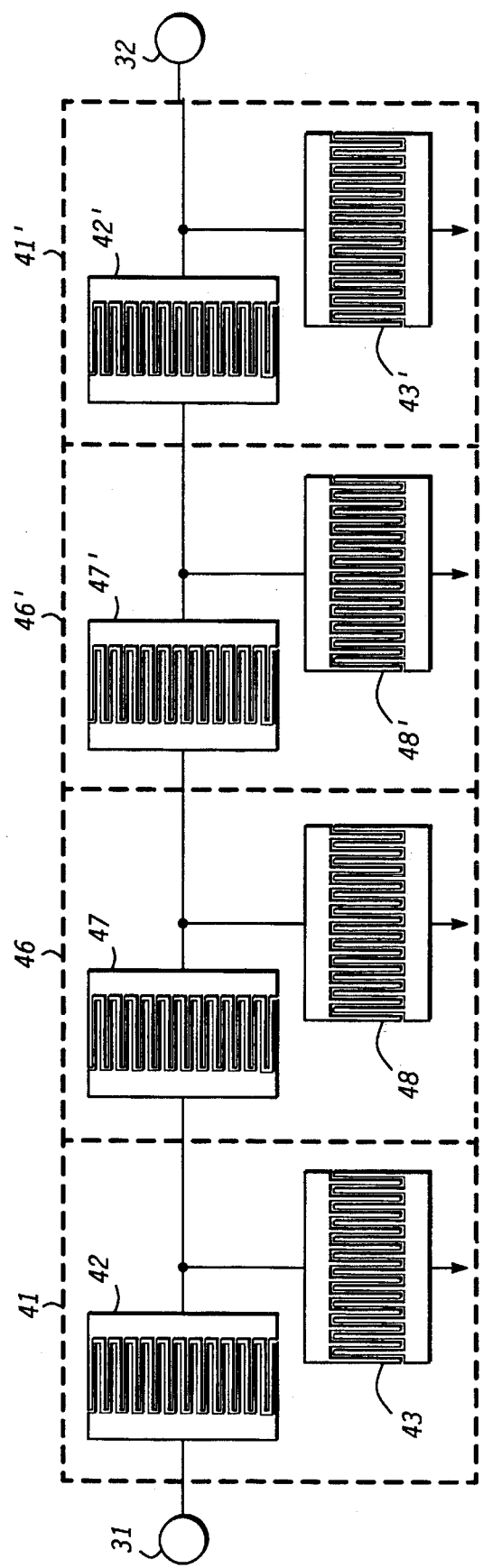
FIG. 4 is a simplified plan view of a four section ladder filter.

FIG. 4 is a simplified plan view of four section ladder filter 40 having first and second electrical ports 31, 32. Transducers comprising series elements 42, 42', 47, 47' and shunt elements 43, 43', 48, 48' typically have principal directions of acoustic wave propagation (analogous to directions 14, 16 of FIG. 1) aligned to a common preferred axis, i.e. parallel to one another. In this example, end sections 41, 41' are chosen to comprise identical elements and similarly middle sections 46, 46'. End sections 41, 41' comprise series elements 42, 42' and shunt elements 43, 43' having 925.8 MHz and 899.7 MHz resonant frequencies $\omega_r$, respectively, while middle sections 46, 46' comprise series elements 47, 47' and shunt elements 48, 48' having 944.2 MHz and 882.6 MHz resonant frequencies $\omega_r$, respectively.

Applicants have discovered that choosing the resonant frequency of series resonant element 42 to be near the antiresonant frequency of shunt element 48 and the resonant frequency of series element 47 to be near the antiresonant frequency of shunt element 43 provides a passband characteristic and complex conjugate matching of section 41 (at the filter center frequency, $Z_{in}$ ca. 50+j20Ω at one side of section 41 when the other side is terminated in 50Ω) to section 46. This provides the filter performance tabulated for design #1 in Table 1. Alternatively, section 41 could be chosen to have a capacitive impedance at the filter center frequency and section 46 to have the conjugate impedance.

TABLE I

Measured ladder filter performance for several different ladder filter designs fabricated using surface wave resonators comprising 301 electrodes with an acoustic beamwidth of 43.9 micrometers on 64° Y-rotated $LiNbO_3$.

| Des. # | # Res. | IL (dB) | 4.5 dB BW (%) | 20 dB BW (%) | Ult. Att. | Cap. rat. | Ser. Co (pF) |
|---|---|---|---|---|---|---|---|
| 1 | 8 | 1.2 | 4.9 | 7.5 | 30 | 1.0 | 3.5 |
| 2 | 7 | 1.3 | 5.4 | 7.6 | 25 | 1.0 | 3.5 |
| 3 | 7 | 0.4 | 5.7 | 7.4 | 20 | 0.7 | 4.5 |
| 4 | 8 | 0.5 | 5.4 | 7.3 | 24 | 0.7 | 4.4 |
| 5 | 8 | 0.3 | 5.7 | 7.3 | 20 | 0.5 | 5.2 |
| 6 | 9 | 0.4 | 5.7 | 7.3 | 23 | 0.5 | 5.4 |
| 7 | 8 | 0.4 | 5.4 | 7.3 | 25 | 0.7 | 4.7 |
| 8 | 8 | 0.4 | 5.3 | 7.2 | 24 | 0.7 | 4.2 |

All of the above employ 7, 8, or 9 resonators (# Res.), show very good insertion loss (IL), and achieve relatively large 4.5 dB and 20 dB bandwidths (BW). Comparison of designs 1, 4, 5 and similarly designs 2, 3 shows that ultimate rejection (Ult. Att.) for ladder filters is determined in part by the capacitance ratio (Cap. rat., the ratio of the series $C_o$ to the shunt $C_o$). At frequencies well removed from filter center frequency $f_o$, the series and shunt elements act as a capacitive voltage divider to determine the ultimate (out-of-band) attenuation (Ult. Att.) or rejection. Comparison of designs 1, 2 and also 5, 6 shows, cet. par., that as the number of L-sections increases, the ultimate rejection also increases.

In accordance with the present invention, series and shunt elements' resonant $\omega_r$ and antiresonant $\omega_a$ frequencies are usefully determined by circuit optimization tools such as SuperCompact®, available from Compact Software of Paterson N.J. One method is to input a series of resonant $\omega_r$ and/or antiresonant $\omega_a$ frequencies in accordance with Eq. 7, with the shunt elements' antiresonant frequencies $\omega_a$ approximately equal to the series elements' resonant frequencies $\omega_r$ and to then enable the circuit optimization tools to determine a modified set of resonant $\omega_r$ and antiresonant $\omega_a$ frequencies. A modified example of a SuperCompact® input file is given below, corresponding to example #1 above and the response given in FIG. 5.

series transducer variables

Con: ?2pF 3pF 6pF?

Cmn: 0.091*con

Fn: ?800 MHz 836.5 MHz 869 MHz?

shunt transducer variables

Con: ?2pF 3pF 6pF?
Cmn: 0.091*con
Fn: ?800 MHz 836.5 MHz 869 MHz?
Parasitics
Rpar: 1.7
Lbw: 1.5 nH
BLK
*nth transducer
CAP 1 4 C=Con
CAP 1 2 C=Cmn
IND 2 3 L=(12/(((2*PI*Fn)**2)*Cmn))
RES 3 4 R=Rpar
Sern: 2POR 14
BLK
FILTER
IND 1 2 L=Lbw
Ser1 2 3
Ser2 3 4
Ser2 4 5
Ser1 5 6
Shunt1 3 8
Shunt2 4 9
Shunt2 5 10
Shunt1 6 11
IND 6 7 L=Lbw
IND 8 0 L=Lbw
IND 10 0 L=Lbw
IND 11 0 L=Lbw
Filter: 2POR 1 7
END
FREQ
STEP 711 MHZ 962 MHZ 1 MHZ
END
OPT
Filter
F=818 MHZ 855 MHZ
  MS21−1 DB GT W=20
  MS11−10 DB LT
  MS22−10 DB LT
F=1 MHZ 806 MHZ
  MS21−30 DB LT W=5
F=863 MHZ 30000 MHZ
MS21−30 DB LT W=5
END An input file corresponding to this example provides C01=Co2=2.8798 pF, Co3=Co4=2.7524 pF, F1=831.94 MHz, F2=845.41 MHz, F3=806.1 MHz and F4=792.84 MHz when the gradient (quasi-Newton gradient method with least squares objective function formulation) and random optimizers are employed.

Ladder filters using surface acoustic wave resonators and especially resonators designed for relatively wide-band performance may be readily scaled in frequency by changing the pitch (periodicity) of the resonator transducer fingers (19, FIG. 1) while maintaining the ratios of the resonant frequencies $\omega_r$ obtained from circuit analysis tools or other methods. This allows a designer to re-use a similar design at a slightly different center frequency fo having similar specifications or permits a quick, two iteration convergence to a desired set of filter characteristics when the relationship between the resonant frequency $\omega_r$ and the transducer acoustic center frequency is not known a priori (e.g., on very high coupling coefficient materials where conventional approximations tend to provide poorer design guidance).

Figure 5:
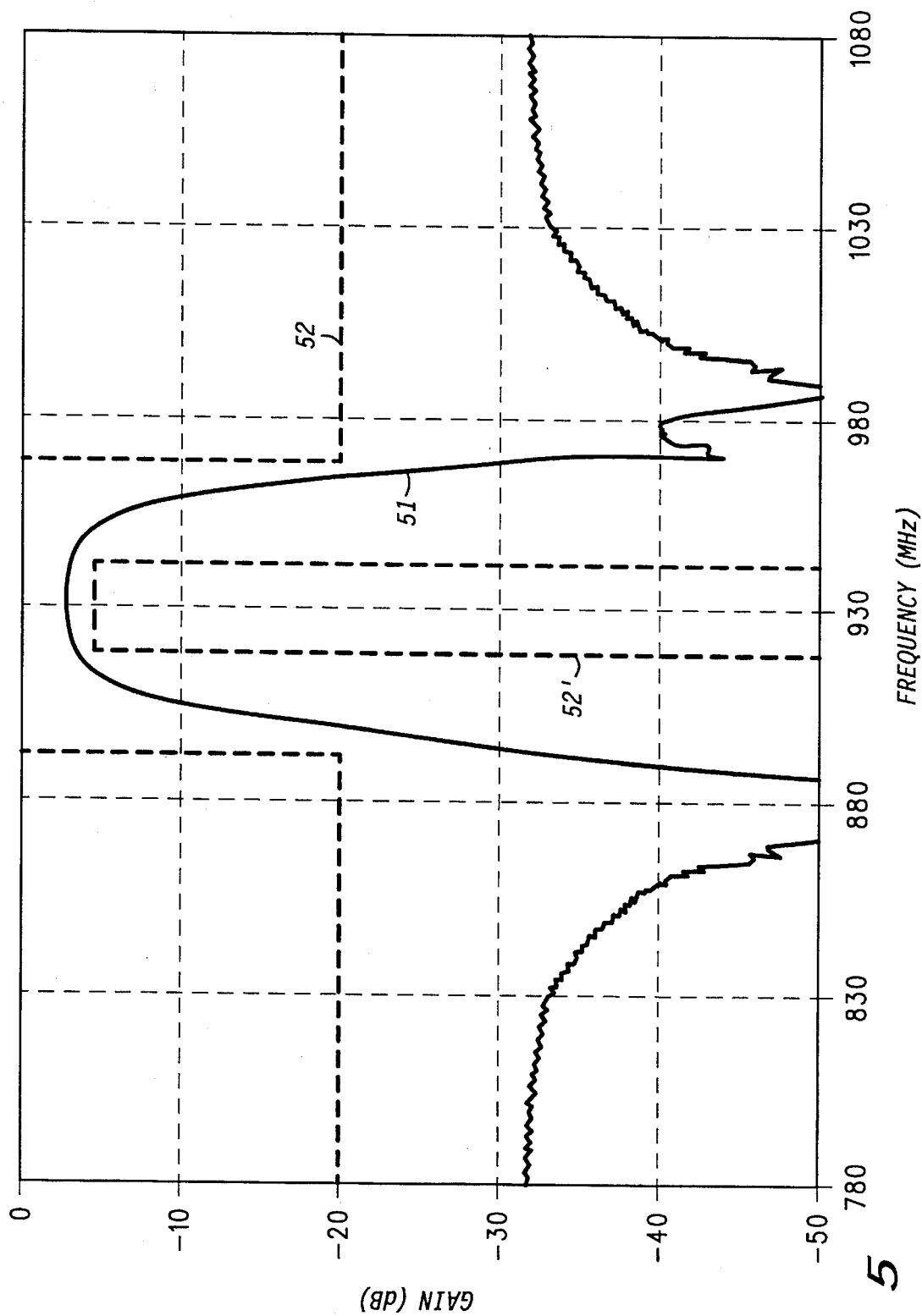
FIG. 5 is a measured frequency response and a specification for the ladder filter of FIG. 4.

FIG. 5 is a graph of measured frequency response 51 (solid trace) and specification 52, 52' (dashed traces) for ladder filter 40 of FIG. 4 built in accordance with the parameters given for design #1 of Table I, optimized in accordance with the SuperCompact example given above but over a different range of frequencies. The measured center frequency insertion loss of 2.5 dB falls between the specified insertion loss bounds of 0 dB and 4.5 dB, while the measured 4.5 dB bandwidth is 4.9% or 45.7 MHz, in agreement with the maximum and minimum bandwidths of 76.9 and 27.9 MHz. The out-of-band rejection exceeds 30 dB over the measured range (780 to 1080 MHz), in contrast to the minimum 20 dB required.

The transducers employed 301 electrodes with an acoustic beamwidth of 43.9 micrometers on 64° Y-rotated $LiNbO_3$.

Measured characteristics 51 provide "room" for temperature-induced and other environmentally-induced changes in filter characteristics and also allow for manufacturing-induced device-to-device variations which may influence characteristics of as-built devices, providing a robust and manufacturable filter design.

Figure 6:
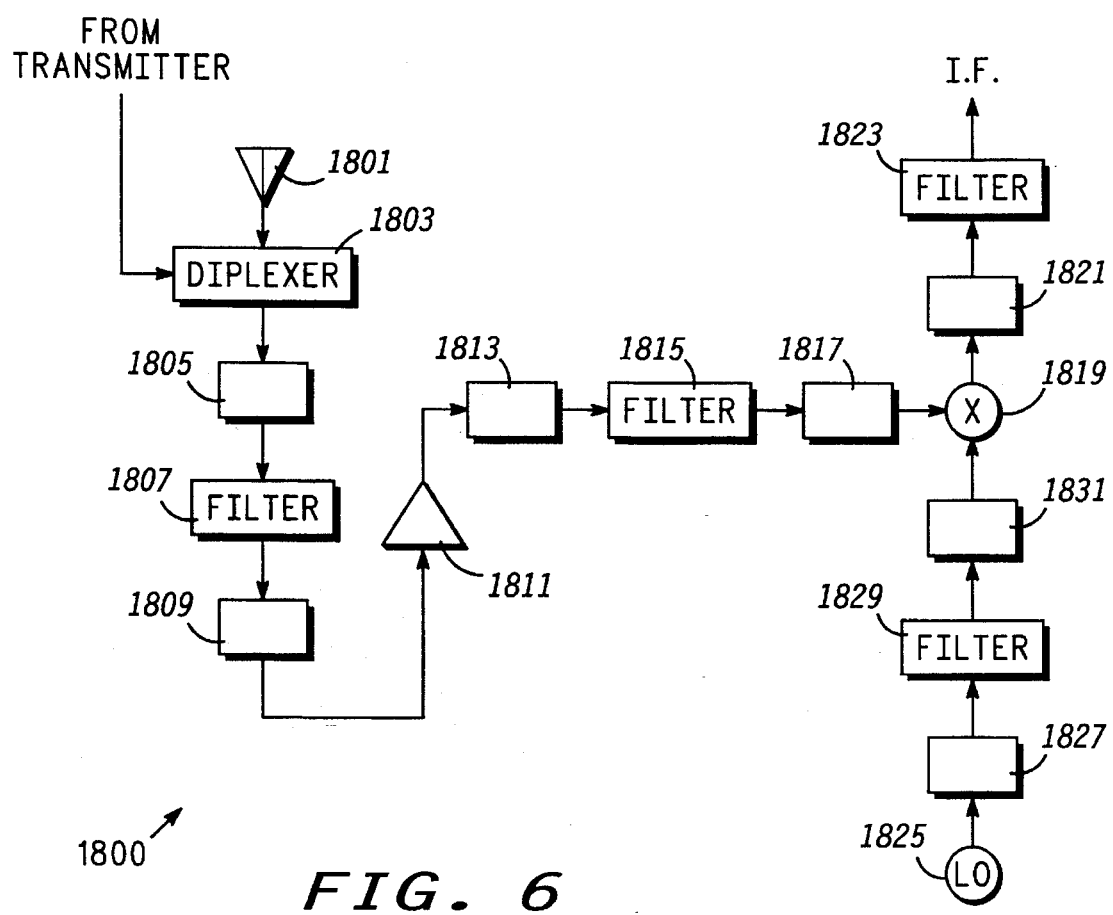
FIG. 6 is a block diagram of a portion of a radio frequency apparatus including ladder filters in accordance with the present invention.

FIG. 6 is a block diagram of portion 1800 of a radio frequency receiver or other radio frequency apparatus including ladder filters in accordance with the present invention. Apparatus 1800 includes antenna 1801, by way of example, used to receive and/or transmit signals. Alternatively, antenna 1801 could be replaced by a fiber-optic link or cable or other signal transmissive media.

Diplexer 1803 is coupled to antenna 1801 and to a transmitter portion (not shown). Diplexer 1803 is a special purpose filter which couples received signals (but not much larger signals from an attached transmitter) to filter 1807 via optional matching circuit 1805 according to the present invention. Filter 1807 is coupled to amplifier 1811 via optional matching element 1809 according to the present invention. The output of amplifier 1811 is transmitted to filter 1815 via optional matching element 1813 according to the present invention. Filter 1815 transmits its output to mixer 1819 via optional matching element 1817 according to the present invention. The signal from filter 1815 is combined in mixer 1819 with another signal from local oscillator 1825 coupled via filter 1829. Matching elements 1827, 1831 and 1821 are optionally provided with filters 1823, 1829. The output signal from mixer 1819 is then filtered by filter 1823 to provide the IF output signal. The arrangement of the present invention may be used to provide any or all of filters 1803, 1807, 1815, 1823, 1829. An oscillator and filter analogous to LO 1825, filter 1829 may be employed together with a suitable amplifier and modulator to provide the signal "FROM TRANSMITTER" and this filter (known as a "transmit clean-up filter") as well may be provided in accordance with the present invention.

Thus, a ladder filter has been described which overcomes specific problems and accomplishes certain advantages relative to prior art methods and mechanisms. The improvements over known technology are significant. The expense, complexities, and high parts count of prior art cascaded filters are avoided. Further, real input and output impedances are realized for compact, lightweight, adjustment-free filters together with improved design flexibility.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

I claim:

1. A method for making a bandpass ladder filter including a center frequency, a first port and a second port, said method comprising steps of:
   providing a first L network including a first connection, a second connection and a net inductive impedance at the center frequency of the bandpass filter;
   providing a second L network including a first connection, a second connection and a net capacitive impedance at the center frequency of the bandpass filter;
   coupling the first connection of the first L network to the first port;
   coupling the first connection of the second L network to the second connection of the first L network; and
   coupling the second connection of the second L network to the second port, wherein including the inductive impedance of the first L network and the capacitive impedance of the second L network provides conjugate impedance matching between the L networks at the center frequency of the bandpass filter.

2. A method as claimed in claim 1, wherein said step of providing a second L network includes a step of matching the capacitive impedance of the second L network to include a reactance substantially equal in magnitude to a reactance of the inductive impedance of the first L network at the center frequency.

3. A method as claimed in claim 1, wherein said step of providing a first L network includes steps of:
   providing a first resonant element including a first terminal, a second terminal, a first resonant frequency and a first antiresonant frequency;
   providing a second resonant element including a second resonant frequency and a second antiresonant frequency, wherein the first resonant frequency is less than the second antiresonant frequency;
   coupling the first terminal of the first resonant element to the first connection of the first L network;
   coupling the second terminal of the first resonant element to the second connection of the first L network; and
   coupling the second resonant element in shunt to ground with the second terminal of the first resonant element.

4. A method as claimed in claim 3, wherein said step of providing a second L network includes steps of:
   providing a third resonant element including a first terminal, a second terminal, a third resonant frequency and a third antiresonant frequency;
   providing a fourth resonant element including a fourth resonant frequency and a fourth antiresonant frequency, wherein the third resonant frequency is greater than the fourth antiresonant frequency;
   coupling the first terminal of the third resonant element to the first connection of the second L network;
   coupling the second terminal of the third resonant element to the second connection of the second L network; and
   coupling the fourth resonant element in shunt with the second terminal of the third resonant element.

5. A method as claimed in claim 3, wherein said steps of providing first and second resonant elements includes steps of:
   providing a first resonant element comprising a first acoustic resonator including the first resonant frequency and the first antiresonant frequency, wherein the first resonant frequency $\omega_{r1}$ is related to the first antiresonant frequency $\omega_{a1}$ by:

$$\omega_{a1}=\omega_{r1}(1+8k^2/\pi^2)^{0.5};$$

and providing a second resonant element comprising a second acoustic resonator including the second resonant frequency and the second antiresonant frequency, wherein the second resonant frequency $\omega_{r2}$ is related to the second antiresonant frequency $\omega_{a2}$ by:

$$\omega_{a2}=\omega_{r2}(1+8k^2/\pi^2)^{0.5},$$

where $k^2$ is an electromechanical coupling coefficient of a common piezoelectric substrate comprising the first and second acoustic resonators, wherein the resonant frequency of the first resonant element $\omega_{r1}$ is less than the antiresonant frequency of the second resonant element $\omega_{a2}$.

6. A method as claimed in claim 4, wherein said steps of providing third and fourth resonant elements includes steps of:
   providing a third resonant element comprising a third acoustic resonator including the third resonant frequency and the third antiresonant frequency, wherein the third resonant frequency $\omega_{r3}$ is related to the third antiresonant frequency $\omega_{a3}$ by:

$$\omega_{a3}=\omega_{r3}(1+8k^2/\pi^2)^{0.5};$$

and providing a fourth resonant element comprising a fourth acoustic resonator including the fourth resonant frequency and the fourth antiresonant frequency, wherein the fourth resonant frequency $\omega_{r4}$ is related to the fourth antiresonant frequency $\omega_{a4}$ through the relation:

$$\omega_{a4}=\omega_{r4}(1+8k^2/\pi^2)^{0.5},$$

where $k^2$ is an electromechanical coupling coefficient of a common piezoelectric substrate comprising the third and fourth acoustic resonators and wherein the resonant frequency of the third resonant element $\omega_{r3}$ is greater than the antiresonant frequency of the fourth resonant element $\omega_{a4}$.

7. A method as claimed in claim 6, wherein said steps of providing third and fourth resonant elements include a step of providing a common piezoelectric substrate having a coupling coefficient greater than 0.07.

8. A bandpass ladder filter including a center frequency, a first port and a second port, said bandpass ladder filter comprising:
   a first L network including a first connection, a second connection and an net inductive impedance at said center frequency of said bandpass ladder filter; and
   a second L network including a first connection, a second connection and a net capacitive impedance at said center frequency, said first connection of said first L network coupled to said first port, said first connection of said second L network coupled to said second connection of said first L network, and said second connection of said second L network is coupled to said second port, wherein including the inductive impedance of the first L network at said center frequency of said bandpass ladder filter and a capacitive impedance of the second L network at said center frequency of said bandpass ladder filter provides conjugate impedance matching between said first and second L networks at said center frequency of said bandpass ladder filter.

9. A filter as claimed in claim 8, wherein said capacitive impedance of said second L network at said center frequency of said bandpass ladder filter includes a reactance substantially equal in magnitude to a reactance of said inductive impedance of said first L network at said center frequency of said bandpass ladder filter.

10. A filter as claimed in claim 8, wherein said first L network includes:

a first resonant element including a first terminal, a second terminal, a first resonant frequency and a first antiresonant frequency; and a second resonant element including a second resonant frequency and a second antiresonant frequency, wherein said first resonant frequency is less than said second antiresonant frequency, said first terminal of said first resonant element coupled to said first connection of said first L network, said second terminal of said first resonant element coupled to said second connection of said first L network, and said second resonant element is coupled in shunt to ground with said second terminal of said first resonant element.

11. A filter as claimed in claim 10, wherein said second L network includes:

a third resonant element including a first terminal, a second terminal, a third resonant frequency and a third antiresonant frequency; and a fourth resonant element including a fourth resonant frequency and a fourth antiresonant frequency, wherein said third resonant frequency is greater than said fourth antiresonant frequency, said first terminal of said third resonant element coupled to said first connection of said second L network, said second terminal of said third resonant element coupled to said second connection of said second L network, and said fourth resonant element is coupled in shunt to ground with said second terminal of said third resonant element.

12. A filter as claimed in claim 10, wherein:

said first resonant element comprises a first acoustic resonator including said first resonant frequency and said first antiresonant frequency, wherein said first resonant frequency $\omega_{r1}$ is related to said first antiresonant frequency $\omega_{a1}$ by:

$$\omega_{a1}=\omega_{r1}(1+8k^2/\pi^2)^{0.5};$$

and said second resonant element comprises a second acoustic resonator including said second resonant frequency and said second antiresonant frequency, wherein said second resonant frequency $\omega_{r2}$ is related to said second antiresonant frequency $\omega_{a2}$ by:

$$\omega_{a2}=\omega_{r2}(1+8k^2/\pi^2)^{0.5},$$

where $k^2$ is an electromechanical coupling coefficient of a common piezoelectric substrate comprising said first and second acoustic resonators, wherein said first resonant frequency $\omega_{r1}$ of said first resonant element is less than said second antiresonant frequency $\omega_{a2}$ of said second resonant element.

13. A filter as claimed in claim 11, wherein:

said third resonant element comprises a third acoustic resonator including said third resonant frequency and said third antiresonant frequency, wherein said third resonant frequency $\omega_{r3}$ is related to said third antiresonant frequency $\omega_{a3}$ by:

$$\omega_{a3}=\omega_{r3}(1+8k^2/\pi^2)^{0.5};$$

and said fourth resonant element comprises a fourth acoustic resonator including said fourth resonant frequency and said fourth antiresonant frequency, wherein said fourth resonant frequency $\omega_{r4}$ is related to said fourth antiresonant frequency $\omega_{a4}$ by:

$$\omega_{a4}=\omega_{r4}(1+8k^2/\pi^2)^{0.5},$$

where $k^2$ is an electromechanical coupling coefficient of a common piezoelectric substrate comprising said third and fourth acoustic resonators, wherein said third resonant frequency $\omega_{r3}$ of said third resonant element is greater than said fourth antiresonant frequency $\omega_{a4}$ of said fourth resonant element.

14. A filter as claimed in claim 13, wherein said common piezoelectric substrate has a coupling coefficient greater than 0.07.

15. In a radio, a bandpass ladder filter including a center frequency, a first port and a second port, said filter comprising:

a substrate comprising a piezoelectric material having an electromechanical coupling coefficient;

a first resonator including a first terminal, a second terminal, a first resonant frequency and a first antiresonant frequency, said first resonator disposed on said substrate, said first terminal coupled to said first port;

a second resonator including a first terminal, a second terminal, a second resonant frequency and a second antiresonant frequency, said second resonator disposed on said substrate, said first terminal of said second resonator coupled to said second terminal of said first resonator and said second terminal of said second resonator coupled to ground to form a first L network including an net inductive impedance at said center frequency of said bandpass ladder filter;

a third resonator including a first terminal, a second terminal, a third resonant frequency and a third antiresonant frequency, said third resonator disposed on said substrate, said first terminal of said third resonator coupled to said second terminal of said first resonator, said second terminal of said third resonator coupled to said second port; and a fourth resonator including a first terminal, a second terminal, a second resonant frequency and a second antiresonant frequency, said fourth resonator disposed on said substrate, said first terminal of said fourth resonator coupled to said second terminal of said third resonator and said second terminal of said fourth resonator coupled to ground, said third and fourth resonators comprising a second L network including a net capacitive impedance at said center frequency of said bandpass ladder filter, said capacitive impedance substantially canceling said inductive impedance at said center frequency of said bandpass ladder filter.

16. A filter as claimed in claim 15, wherein said electromechanical coupling coefficient exceeds 0.5%.

17. A filter as claimed in claim 15, wherein said first, second, third and fourth resonators comprise surface acoustic wave transducers.

18. A filter as claimed in claim 15, wherein said first, second, third and fourth resonators comprise surface acoustic wave transducers including first, second, third and fourth acoustic resonant frequencies and first, second, third and fourth acoustic center frequency wavelengths, said first transducer including electrodes one-fourth of said first acoustic center frequency wavelength in width, said second transducer including electrodes one-fourth of said second acoustic center frequency wavelength in width, said third transducer including electrodes one-fourth of said third acoustic center frequency wavelength in width and said fourth transducer including electrodes one-fourth of said fourth acoustic center frequency wavelength in width.

19. A filter as claimed in claim 15, wherein said first, second, third and fourth resonators comprise surface acoustic wave transducers each including acoustic reflectors disposed adjacent said surface acoustic wave transducers in a principal direction of acoustic wave propagation.

20. A filter as claimed in claim 15, wherein said substrate includes sixty four degree rotated lithium niobate.

21. A filter as claimed in claim 15, wherein:

said first resonator comprises a first acoustic resonator including a first resonant frequency and a first antiresonant frequency, wherein said first resonant frequency $\omega_{r1}$ is related to said first antiresonant frequency $\omega_{a1}$ by:

$$\omega_{a1}=\omega_{r1}(1+8k^2/\pi^2)^{0.5};$$

said second resonator comprises a second acoustic resonator including a second resonant frequency and a second antiresonant frequency, wherein said second resonant frequency $\omega_{r2}$ is related to said second antiresonant frequency $\omega_{a2}$ by:

$$\omega_{a2}=\omega_{r2}(1+8k^2/\pi^2)^{0.5},$$

wherein said first resonant frequency $\omega_{r1}$ is less than said second antiresonant frequency $\omega_{a2}$;

said third resonator comprises a third acoustic resonator including a third resonant frequency and a third antiresonant frequency, wherein said third resonant frequency $\omega_{r3}$ is related to said third antiresonant frequency $\omega_{a3}$ by:

$$\omega_{a3}=\omega_{r3}(1+8k^2/\pi^2)^{0.5};$$

and said fourth resonator comprises a fourth acoustic resonator including a fourth resonant frequency and a fourth antiresonant frequency, wherein said fourth resonant frequency $\omega_{r4}$ is related to said fourth antiresonant frequency $\omega_{a4}$ by:

$$\omega_{a4}=\omega_{r4}(1+8k^2/\pi^2)^{0.5},$$

where $k^2$ is an electromechanical coupling coefficient of said substrate and wherein said third resonant frequency $\omega_{r3}$ is greater than said fourth antiresonant frequency $\omega_{a4}$.

* * * * *